(12) United States Patent
Secrest et al.

(10) Patent No.: US 11,927,662 B2
(45) Date of Patent: Mar. 12, 2024

(54) DETERMINATION OF DIAGNOSTIC PLAUSIBILITY OF PHASE CURRENT MEASUREMENTS

(71) Applicant: BorgWarner Inc., Auburn Hills, MI (US)

(72) Inventors: Caleb W. Secrest, Noblesville, IN (US); James R. Smith, Levittown, PA (US)

(73) Assignee: BORGWARNER INC., Auburn Hills, MI (US)

(*) Notice: Subject to any disclaimer, the term of this patent is extended or adjusted under 35 U.S.C. 154(b) by 22 days.

(21) Appl. No.: 17/742,870

(22) Filed: May 12, 2022

(65) Prior Publication Data

US 2023/0366968 A1 Nov. 16, 2023

(51) Int. Cl.
*G01R 19/00* (2006.01)
*G01P 3/48* (2006.01)
*G01R 35/00* (2006.01)
*H02P 23/14* (2006.01)

(52) U.S. Cl.
CPC ............... *G01R 35/00* (2013.01); *G01P 3/48* (2013.01); *G01R 19/0038* (2013.01); *H02P 23/14* (2013.01)

(58) Field of Classification Search
CPC ....... G01R 35/00; G01R 19/0038; G01P 3/48; H02P 23/14
See application file for complete search history.

(56) References Cited

U.S. PATENT DOCUMENTS

2017/0045588 A1* 2/2017 Aoki ................. H01M 8/04992

FOREIGN PATENT DOCUMENTS

| DE | 102020100272 A1 * | 7/2020 | ........... G01R 31/343 |
| EP | 2226929 A1 * | 9/2010 | ........... G01R 31/343 |
| WO | WO-2019115143 A1 * | 6/2019 | ............. G01R 29/16 |

* cited by examiner

*Primary Examiner* — Feba Pothen
(74) *Attorney, Agent, or Firm* — CANTOR COLBURN LLP

(57) ABSTRACT

A method of evaluating current sensor measurements of an electric machine system includes acquiring a first current signal corresponding to a first measurement of a first phase current of a three phase electric current supply to an electric machine, and acquiring a second current signal corresponding to a second measurement of a second phase current of the three phase electric current supply. The method also includes determining a machine velocity, shifting the first current signal by a signal processing component to generate a shifted first current signal having a shifted phase, the signal processing component including a tuning parameter that is a function of the machine velocity, calculating an amplitude difference between the shifted first current signal and the second current signal, and determining a plausibility of the first measurement and the second measurement based on the difference.

20 Claims, 6 Drawing Sheets

DETERMINATION OF DIAGNOSTIC PLAUSIBILITY OF PHASE CURRENT MEASUREMENTS

BACKGROUND OF THE INVENTION

Exemplary embodiments pertain to the art of electric machines and monitoring of electric machines and, in particular, to determination of plausibility of current measurements of electric machines.

Alternating current (AC) electric machines, such as synchronous electric motors, are used in a variety of industries. One such industry is the automotive industry. For example, hybrid and electric vehicles include AC motors with high torque densities and power requirements. To ensure proper operations, various sensors and control systems are used to monitor motor system components such as current sensors.

BRIEF DESCRIPTION OF THE INVENTION

Disclosed is a method of evaluating current sensor measurements of an electric machine system. The method includes acquiring a first current signal from a first current sensor, the first current signal corresponding to a first measurement of a first phase current of a three phase electric current supply to an electric machine, and acquiring a second current signal from a second current sensor, the second current signal corresponding to a second measurement of a second phase current of the three phase electric current supply. The method also includes determining a machine velocity, shifting the first current signal by a signal processing component to generate a shifted first current signal having a shifted phase, the signal processing component including a tuning parameter that is a function of the machine velocity, calculating an amplitude difference between the shifted first current signal and the second current signal, and determining a plausibility of the first measurement and the second measurement based on the difference.

Disclosed is a system for evaluating current sensor measurements of an electric machine system, which includes a processing module configured to acquire current sensor measurements from a first current sensor and a second current sensor connected to a three phase electric current supply to an electric machine, the first current sensor configured to measure a first phase current of the electric current supply, the second current sensor configured to measure a second phase current of the electric current supply. The processing module is configured to acquire a first current signal corresponding to a first measurement of the first phase current from the first current sensor, acquire a second current signal corresponding to a second measurement of the second phase current from the second current sensor, and determine a machine velocity. The processing module is also configured to shift the first current signal by a signal processing component to generate a shifted first current signal having a shifted phase, the signal processing component including a tuning parameter that is a function of the machine velocity, calculate an amplitude difference between the shifted first current signal and the second current signal, and determine a plausibility of the first measurement and the second measurement based on the difference.

Disclosed is a computer program product including a computer-readable memory that has computer-executable instructions stored thereupon, the computer-executable instructions when executed by a processor cause the processor to perform operations. The operations include acquiring a first current signal from a first current sensor, the first current signal corresponding to a first measurement of a first phase current of a three phase electric current supply to an electric machine, and acquiring a second current signal from a second current sensor, the second current signal corresponding to a second measurement of a second phase current of the three phase electric current supply. The operations also include determining a machine velocity, shifting the first current signal by a signal processing component to generate a shifted first current signal having a shifted phase, the signal processing component including a tuning parameter that is a function of the machine velocity, calculating an amplitude difference between the shifted first current signal and the second current signal, and determining a plausibility of the first measurement and the second measurement based on the difference.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of one or more embodiments of the disclosed apparatus and method are presented herein by way of exemplification and not limitation with reference to the Figures.

Devices, systems and methods are provided for monitoring current sensors that measure current supplied to an electric machine, such as a synchronous alternating current (AC) electric motor. An embodiment of a method includes acquiring phase current measurements from each of two current sensors. Each of the current sensors is configured to measure one phase of three-phase current supplied to the electric machine. Each phase of the supplied current is referred to as a "phase current."

The method includes taking a measurement of one phase of the supplied current (a first current measurement), and simultaneously or concurrently taking a measurement of another phase of the supplied current (a second current measurement). The first current measurement is input to a monitoring module or other processing component, along with a representation of the phase current frequency and sequence (e.g., a measurement, estimation, or calculation of motor velocity). The monitoring module, in an embodiment, includes an all-pass filter that phase shifts the first current measurement based on a first order transfer function.

The motor velocity is converted to a frequency value that is used to estimate a value of a tuning parameter of the transfer function. For example, the motor velocity is input to a lookup table, which outputs a corresponding parameter value. The parameter value is input with the first current measurement to the all-pass filter, and the all-pass filter outputs a phase shifted current signal, which is compared to the second current measurement. If a difference between the shifted current signal and the second current measurement (e.g., a difference between amplitudes at a given sample time) is less than a selected threshold, the first and second current measurements are considered to be plausible. Otherwise, the current measurements are not considered plausible, which may be indicative of a fault or malfunction of either current sensor or both current sensors.

Embodiments described herein present a number of advantages. For example, the embodiments provide a diagnostic system that can be effectively used with a two-sensor system (i.e., a system having current sensors measuring only two of the three phase currents). The embodiments thus can eliminate the need for three separate current sensors, thereby reducing complexity and cost.

Figure 1:
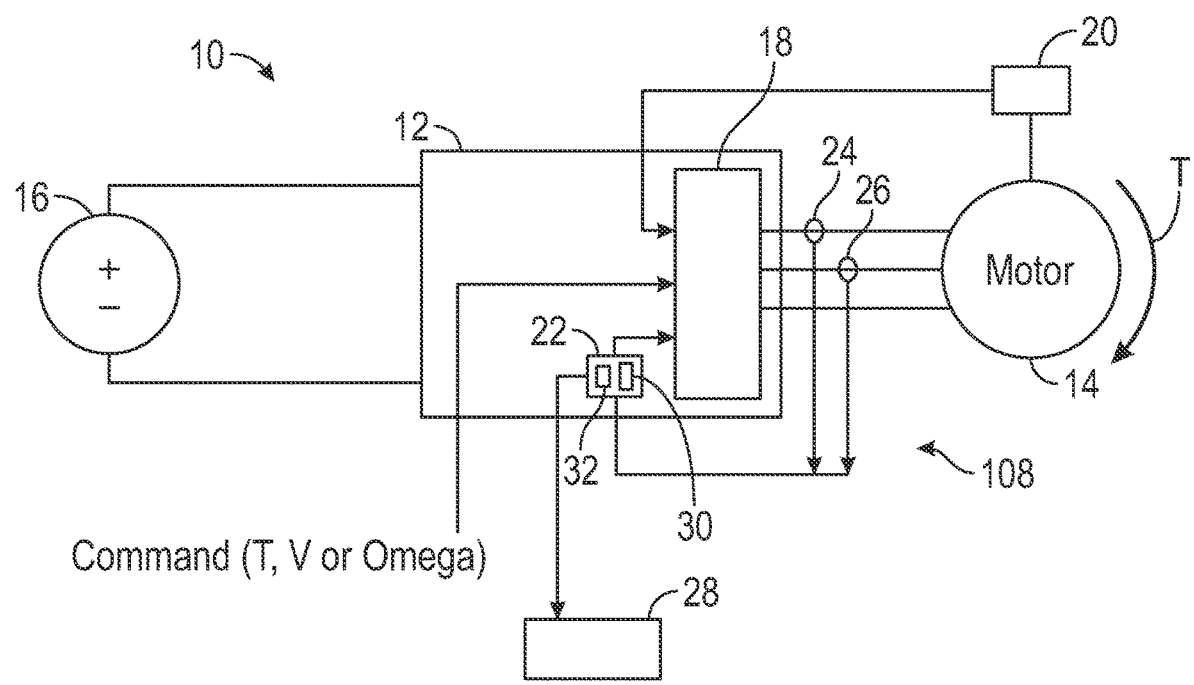
FIG. 1 depicts an embodiment of an electric motor system and a processing unit for performing aspects of monitoring and diagnostic evaluation of current sensors.

FIG. 1 depicts an embodiment of an electric motor system 10, which includes a monitoring and control device 12 (also referred to as a controller) and a synchronous AC electric motor 14. The motor 14 receives three phase AC power and produces output torque T. The controller 12 is electrically connected to a DC power source 16 such as a battery or other DC power storage element. The three phase AC power is output via respective leads or wires as a phase A current, a phase B current and a phase C current.

The controller 12 includes electronics for converting DC power to an AC output and providing the three phase AC power to the motor 14. In an embodiment, the controller 12 includes a control module 18 that receives motor commands (e.g., in voltage, torque or speed (ω)), and current measurements from multiple current sensors. The control module 18 may also receive a motor velocity as measured by a motor velocity sensor 20 (or motor position sensor used to estimate motor velocity).

In an embodiment, the controller 12 includes a current sensor processing module 22 configured to receive and process current measurements. The processing module 22 may analyze and/or process received measurements, and provide current information indicating the value of each phase of the supplied current to the control module 18.

In an embodiment, the motor system 10 includes two current sensors, in which each current sensor is configured to measure one phase current. For example, as shown in FIG. 1, the motor system 10 includes a first sensor 24 (phase A sensor) configured to measure phase A current, and a second sensor 26 (phase B sensor) configured to measure phase B current. It is noted that the current sensors 24 and 26 are not limited to this example, and can be configured to measure any two of the phase A, phase B and phase C currents.

The processing module 22, in an embodiment, performs aspects of a current sensor evaluation method that includes determining whether current measurements are plausible. A "plausible" current measurement is a measurement having a value that is associated with a properly operating current sensor.

In an embodiment, the processing module 22 includes an all-pass filter 30). The all-pass filter 30 and processing module 22, in an embodiment, are implemented via digital signal processing, but are not so limited, as all or some of the functions of the processing module 22 could be implemented via hardware circuitry. The all-pass filter 30 is configured to shift the phase of a current signal using a constant phase shift that is independent of the frequency of the current signal. The all-pass filter 30, in an embodiment, has an impulse response or system response that shifts current signals across the entire frequency spectrum. The z-transform of the all- pass filter response can be represented by a transfer function H(z):

$$H(z) = \frac{z^{-1} + a_1}{a_1 z^{-1} + 1} \quad (1)$$

The above transfer function H(z) is represented in the complex z-domain and is a first order function that includes one coefficient $\alpha_1$, also referred to as a tuning parameter $\alpha_1$. The tuning parameter a1 controls the phase response of the all-pass filter 30 as a function of frequency.

The tuning parameter $\alpha_1$, in an embodiment, is estimated for a given input signal and input signal frequency such that the all-pass filter 30 shifts the input signal by −120 degrees regardless of the input signal fundamental frequency. The filter 30 is tuned by controlling the tuning parameter as a function of motor velocity. The motor velocity corresponds to the rotational rate of the motor 14.

The tuning parameter $\alpha_1$ can be estimated in any suitable manner. For example, the processing module 22 can mathematically calculate $\alpha_1$ upon receipt of an input signal for use in the all-pass filter 30. In another example, $\alpha_1$ values corresponding to various frequency set points can be estimated in advance and stored such the processing module 22 can select an appropriate $\alpha_1$ value without performing any calculations at the time of plausibility determination.

In an embodiment, the processing module 22 includes or has access to a look-up table (LUT) or other data structure that allows the processing module 22 to select an $\alpha_1$ value as a function of motor velocity. The LUT is constructed by calculating $\alpha_1$ for a plurality of input signal frequencies within a selected frequency range.

Figure 2:
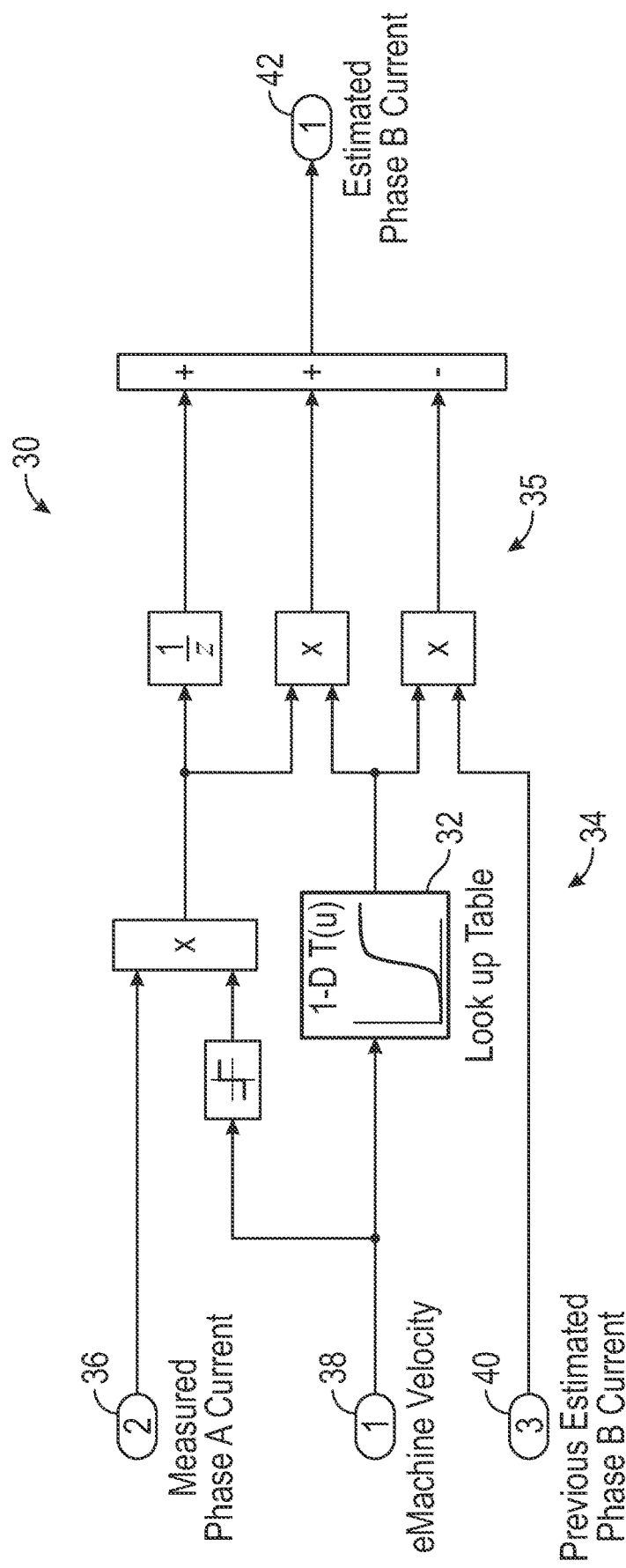
FIG. 2 depicts an embodiment of a filter configured to phase shift an input current measurement signal.

FIG. 2 depicts portions of an embodiment of the all-pass filter 30 for performing aspects of plausibility determination and diagnostic evaluation of a current sensor. The all-pass filter 30 receives a current signal corresponding to a first measurement (e.g., measurement of the phase A current), and shifts the current signal to generate a shifted current signal. If the phase A sensor is operating properly, the shifted current signal should be the same or similar to a concurrent phase B signal.

The all-pass filter 30 includes input logic 34 for inputting current signals and motor velocity to the all-pass filter 30. The all-pass filter 30 also includes filter logic 35 for shifting an input current signal. A "current signal" refers to an output of a current sensor in response to measurement of a phase current.

The input logic 34 receives a measured phase A current signal 36, a motor velocity value 38 (e.g., a rotational rate or motor velocity converted from the rotational rate) and a previously estimated phase B current signal 40 (i.e., a previously shifted phase A current signal). The measured phase A current signal 36 is an amplitude of the phase A current at a given sample time. The previously estimated phase B current signal 40 corresponds to the output of the all-pass filter in a previous iteration.

The input logic 34 applies the measured phase A current signal 36, and acquires a value of the tuning parameter $\alpha_1$ from a LUT 32. The tuning parameter $\alpha_1$ is estimated by extracting a value of $\alpha_1$ that corresponds to the motor velocity from the LUT 32. The extracted value $\alpha_1$ is applied to the all-pass filter 30, which outputs a shifted current signal 42 (also referred to as an estimated phase B current) based on the extracted $\alpha_1$ and the transfer function H(z). If both current sensors are operating properly, the shifted current signal 42 has an amplitude that is the same as, or within a threshold value of, an amplitude of the estimated phase B current or shifted current signal 42.

Figure 3:
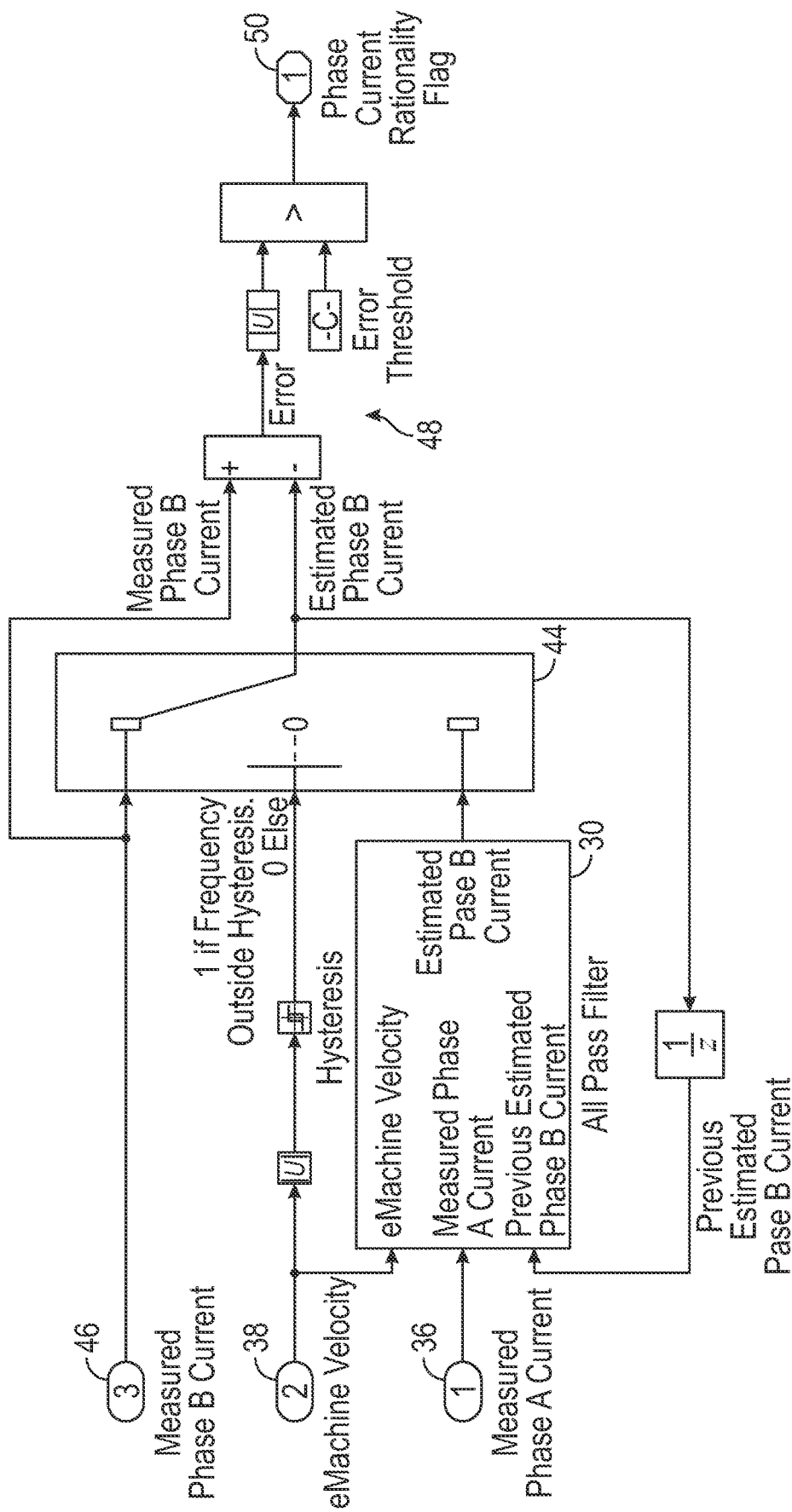
FIG. 3 depicts application of the filter of FIG. 2 for determining diagnostic plausibility of phase current measurements.

FIG. 3 depicts an embodiment of processing module logic, which includes the all-pass filter 30 and the LUT 32, a hysteresis comparator 44, and a comparator 48 for comparing the shifted current signal 42 and a measured phase B current signal 46.

The hysteresis comparator 44 receives the absolute value of the motor velocity signal 38 (i.e., motor speed) as an input frequency and disables the all-pass filter 30 if the input frequency is above an upper frequency boundary or is lower than a lower frequency boundary. If the motor speed is outside of a boundary, the hysteresis comparator 44 outputs the measured phase B current signal 46; otherwise, the comparator 44 relays the all-pass filter output (shifted current signal 42) to the comparator 48. The comparator 48 determines a difference between the measured phase B current amplitude and the shifted current signal amplitude, and compares the difference to a configurable error threshold C. The processing module 22 can output a rationality flag 50 or other indication as to whether the measurement is plausible. Both the measured phase A current signal 36 and the measured phase B current signal 46 are plausible if the difference is less than or equal to the threshold C.

Figure 4:
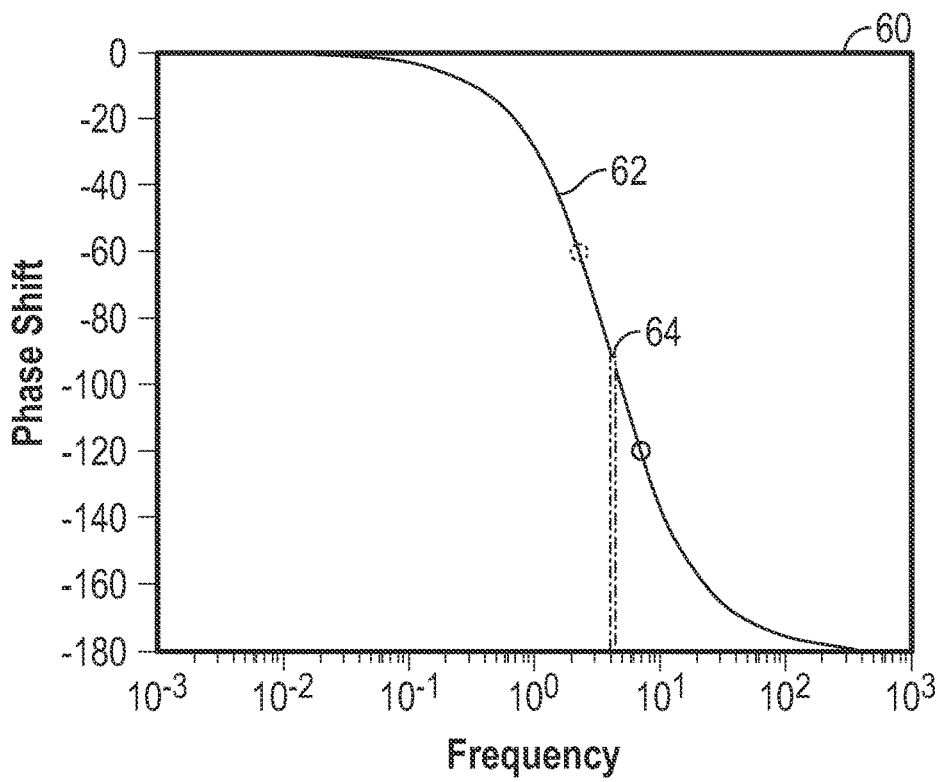
FIG. 4 depicts an example of a plot of a response of the filter of FIG. 2, and depicts aspects of an example of determining a tuning parameter of the filter.
Figure 5:
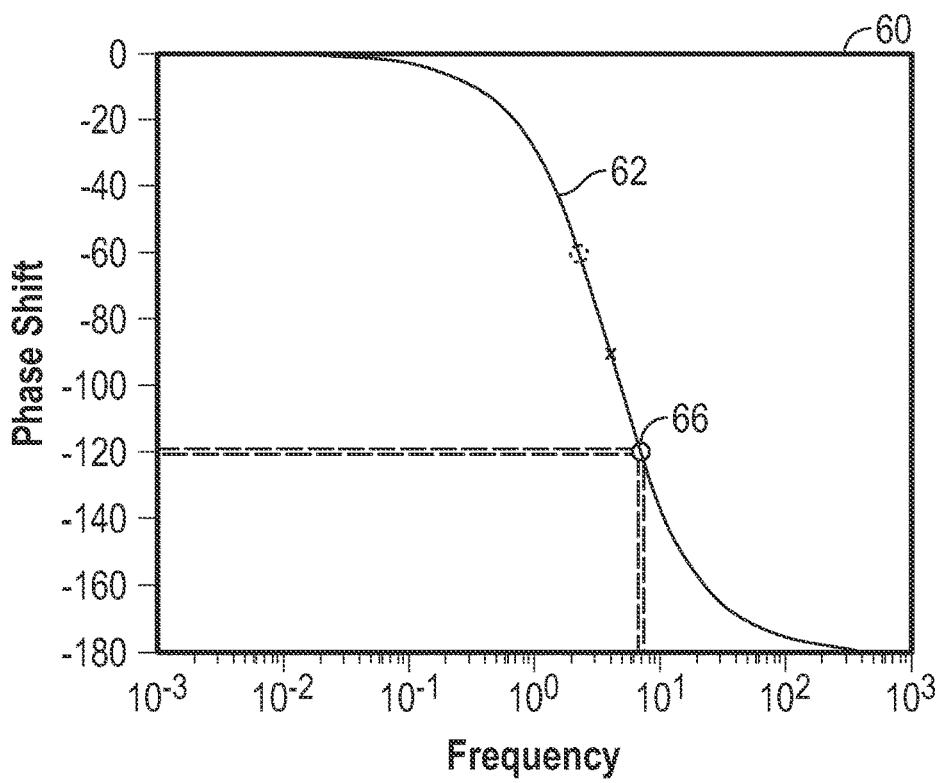
FIG. 5 depicts the plot of FIG. 4.
Figure 6:
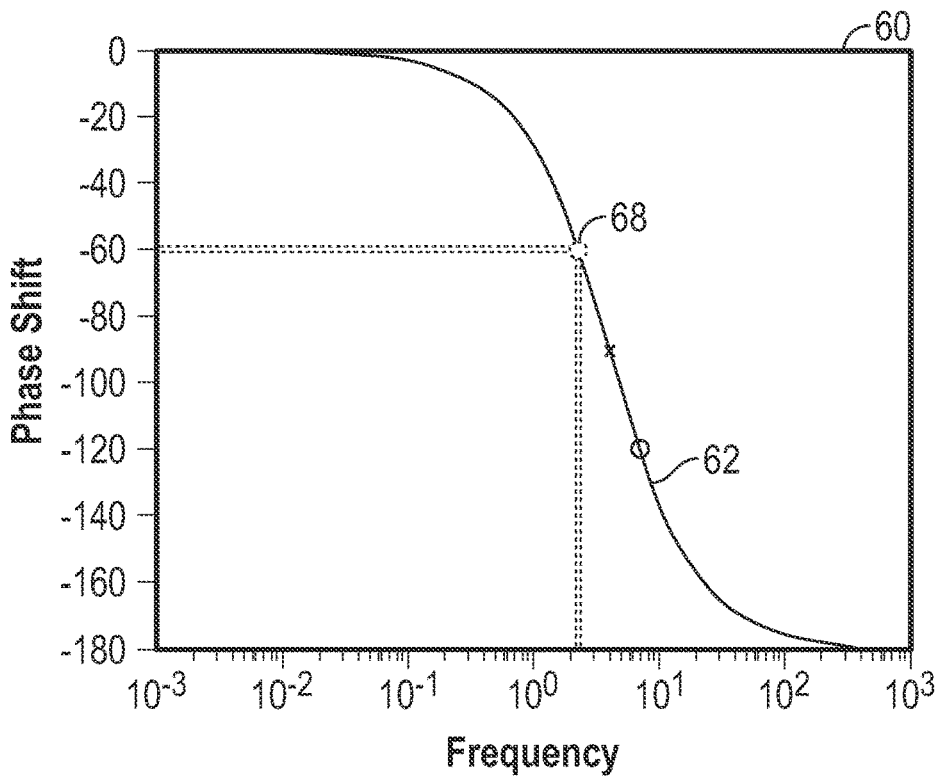
FIG. 6 depicts the plot of FIGS. 4 and 5.

FIGS. 4-6 depict aspects of an example of calculation of the tuning parameter $\alpha_1$. In this example, a value of the tuning parameter $\alpha_1$ is calculated for each of a plurality of input signal frequencies. Each input signal frequency may correspond to a respective motor speed. In this example, the all-pass filter response is modeled as a Bode response. The Bode response is estimated by calculating bode plots that graph the frequency response of the all-pass filter 30. A bode plot may include a Bode magnitude plot representing the magnitude of the frequency response, and/or a Bode phase plot representing the phase shift.

In this example, using the definition of the z-transform, the following equation can be derived for calculation of at based on a frequency setpoint $F_e$ and the sampling frequency $F_s$ by which a phase current is sampled:

$$a_1 = \frac{\tan\left(\frac{\pi F_c}{F_s}\right) - 1}{\tan\left(\frac{\pi F_c}{F_s}\right) + 1} \quad (2)$$

In the above equation, the frequency setpoint $F_e$ is the frequency of a signal that will be shifted by −90 degrees. $\alpha_1$ can be calculated across a selected frequency spectrum to derive values of $\alpha_1$ such that, when the processing module 22 receives an input signal having a given frequency, a value of $\alpha_1$ is provided that will shift the input signal by −90 degrees by using the input signal frequency as the frequency setpoint.

FIG. 4 depicts a graph 60 of phase (in degrees) as a function of frequency (on a logarithmic scale), showing a curve 62 representing a Bode plot of a signal with a frequency setpoint $F_e$ of 4 Hz. The curve 62 is a plot of the response of the filter using a value of al calculated based on equation (2). Point 64 represents the 4 Hz frequency value and its corresponding −90 degree phase shift.

As the phase currents are configured to have a phase separation of 120 degrees, an interpolation function or other suitable analysis may be used to determine the frequency at which the phase shift is 120 degrees. FIG. 5 shows the results of the interpolation, which yield a frequency value at −120 degrees, shown as point 66. The frequency value at point 66, and the associated $\alpha_1$ value (calculated using equation (2), is stored in the LUT 32 or other data structure. For negative frequencies, an interpolation function is used to determine the frequency value (shown as point 68 in FIG. 6) at −60 degrees and calculate the associated $\alpha_1$ value. This process is repeated for a plurality of frequency setpoints, so that an $\alpha_1$ value is estimated for each frequency setpoint.

Figure 7:
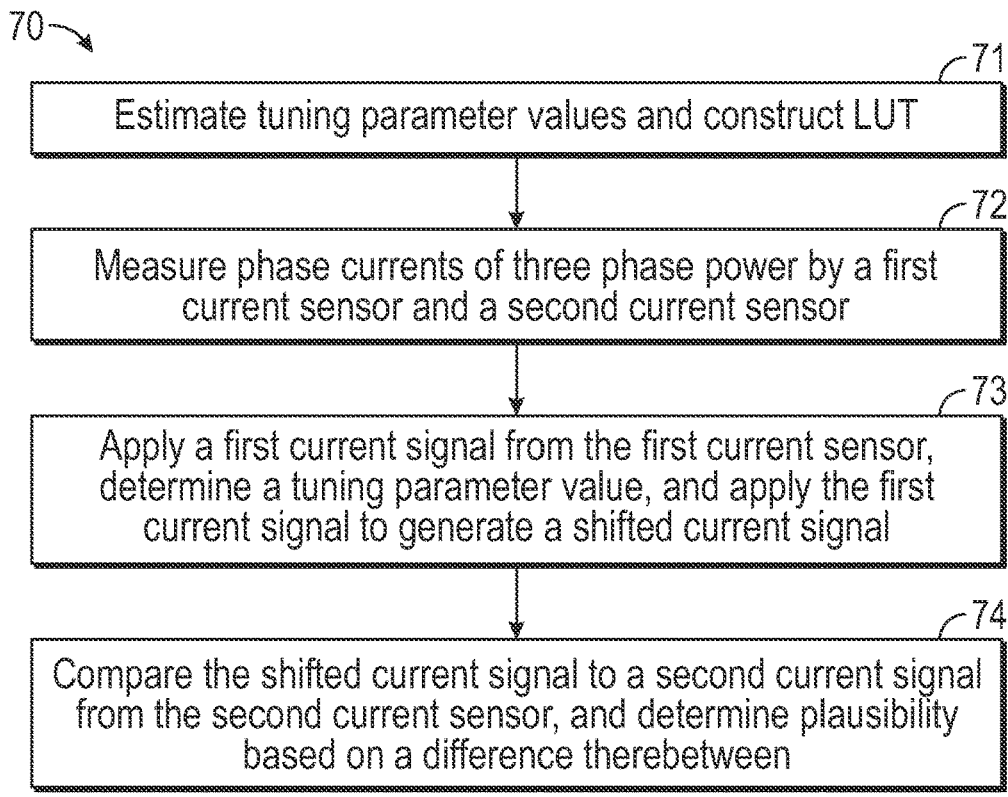
FIG. 7 is a flow diagram depicting an embodiment of a method of monitoring and evaluating a current sensor connected to a three phase power supply to an electric machine.

FIG. 7 illustrates an embodiment of a method 70 of monitoring current sensors of an electric machine system and evaluating the current sensors. Aspects of the method 70 may be performed by a processor or processors, such as the control module 18 and/or the processing module 22. It is noted that the method 70 may be performed by any suitable processing device or system, or combination of processing devices, or any suitable technology platform.

The method 70 includes a number of steps or stages represented by blocks 71-74. The method 70 is not limited to the number or order of steps therein, as some steps represented by blocks 71-74 may be performed in a different order than that described below, or fewer than all of the steps may be performed.

Aspects of the method 70 are discussed in conjunction with the system 10 shown in FIG. 1, for illustration purposes. The method 70 is not so limited and can be used with any suitable system that utilizes a synchronous AC electric motor or other electric machine.

In addition, the method 70 is described as evaluating current measurements of a phase A current based on a comparison with measurements of a phase B current. However, the method is not so limited as any of phase A, B and C current measurements may be evaluated in comparison with any other phase current measurement.

At block 71, the system 10 may be initially calibrated to generate a LUT or other data structure that stores values of the $\alpha_1$ tuning parameter correlated with motor velocities. For example, the LUT 32 is constructed by iteratively estimating the all-pass filter response to each of a plurality of frequencies and estimating corresponding values of $\alpha_1$.

At block 72, measurements of two phase currents of three phase power supplied to an electric machine (e.g., the AC motor 14) are taken. For example, during operation of the motor 14, a first current sensor (e.g., the phase A current sensor 24) measures phase A current, and a second current sensor (e.g., the phase B current sensor 26) measures phase B current.

At block 73, a first current signal is acquired from the first current sensor, and the first current signal is applied to the all-pass filter 30. In addition, a motor velocity is input to the LUT 32, and a corresponding $\alpha_1$ value is extracted. The all-pass filter 30 outputs a shifted current signal using the $\alpha_1$ value.

At block 74, the amplitude of the shifted current signal is compared to a second current signal acquired from the second current sensor. A difference between the shifted current signal and the second current signal (e.g., a difference between the amplitude of each signal at a given sample time) is estimated. The current measurements are considered plausible if the difference is less than a selected threshold difference value.

Various actions can be performed in the event that the first current measurement is considered implausible. For example, the output or an indication of a fault can be transmitted to a diagnostic module and/or a remote location for diagnostics. In another, the motor can be shut off and submitted for further diagnostics or repair.

Figure 8:
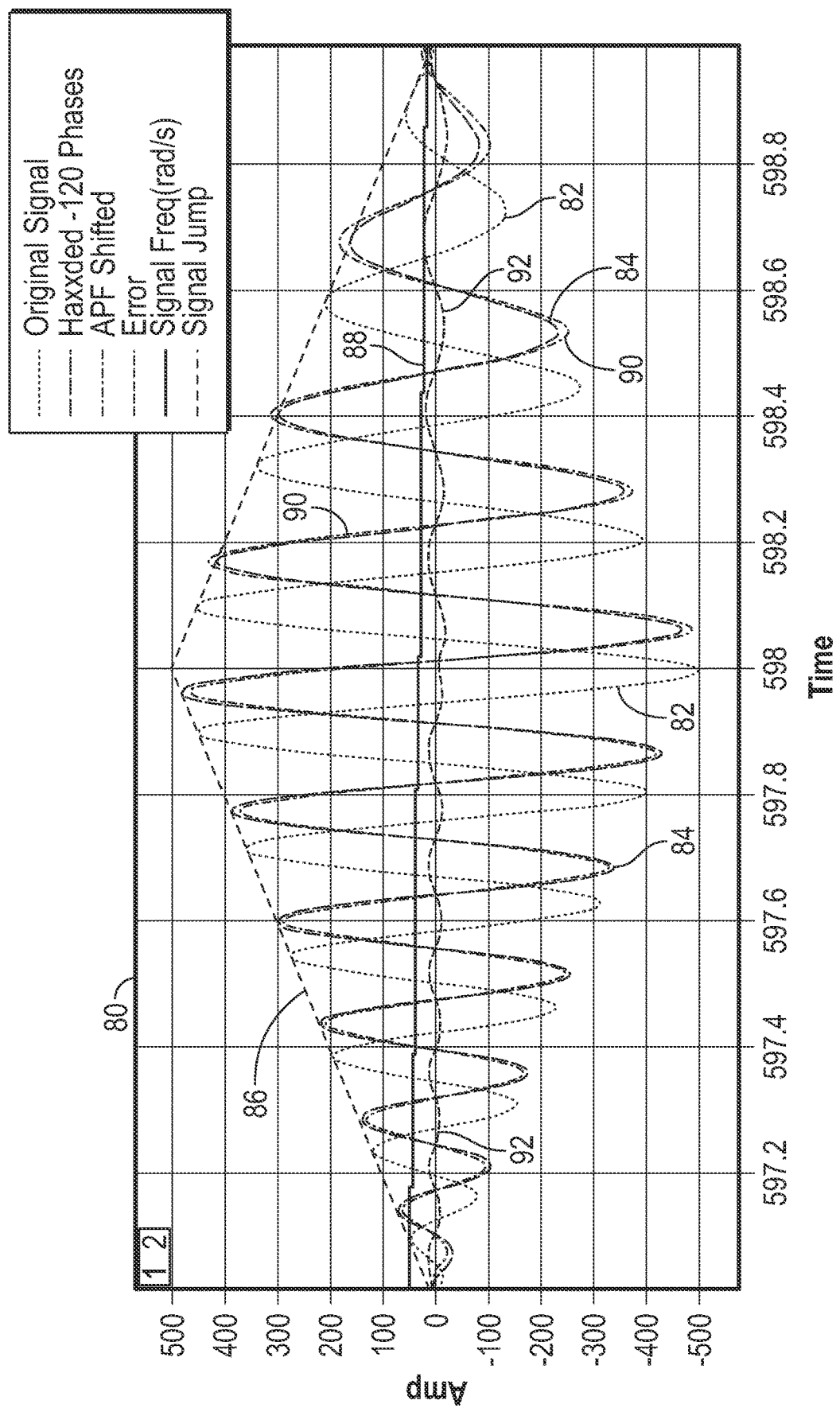
FIG. 8 is a graph depicting aspects of an example of monitoring and evaluating a current sensor.

FIG. 8 is a graph 80 showing an example of current measurements, and determination of the plausibility of a phase A current sensor. In this example, a phase A current signal represented by curve 82 was shifted as discussed herein, and compared to a phase B current signal represented by curve 84. Signal amplitude is shown by line 86, and signal frequency is shown by curve 88. The shifted phase A current signal is shown by curve 90.

The comparison between the original phase B current signal (curve 84) and the shifted signal (curve 90) is shown as an error curve 92. In this example, the error curve 92 amplitude is within a selected error value threshold along the entire time spectrum, indicating that the measurements are plausible. If the error curve 92 amplitude exceeds the threshold at one or more times or time periods, the measurements may be considered implausible and a corresponding flag or indication is output.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The present invention may be a system, a method, and/or a computer program product at any technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A method of evaluating current sensor measurements of an electric machine system, comprising:
acquiring a first current signal from a first current sensor, the first current signal corresponding to a first phase current of a three phase electric current supply to an electric machine, the first phase current separated from a second phase current by a selected phase separation;

acquiring a second current signal from a second current sensor, the second current signal corresponding to the second phase current;

measuring a machine speed;

shifting the first current signal by a signal processing component to generate a shifted first current signal having a shifted phase, the signal processing component including a tuning parameter that is a function of the machine speed, the signal processing component including an all pass filter configured to shift the first current signal using the tuning parameter;

estimating a phase difference between the shifted first current signal and the second current signal; and determining a plausibility of the first measurement based on the difference.

2. The method of claim 1, further comprising evaluating whether the first current sensor is operating properly based on the plausibility.

3. The method of claim 1, wherein determining the plausibility includes comparing the difference to a selected threshold difference value, and determining that the first measurement is plausible based on the difference being less than or equal to the threshold difference value.

4. The method of claim 1, wherein the signal processing component is configured to shift the first current signal independent of a frequency of the first current signal.

5. The method of claim 1, wherein the all pass filter is configured to shift the first current signal without affecting an amplitude of the first current signal.

6. The method of claim 1, wherein the all pass filter is configured to shift the first current signal using a first order transfer function including the tuning parameter.

7. The method of claim 6, wherein the shifting includes determining a machine speed frequency based on the machine speed, estimating a value of the tuning parameter based on the machine speed frequency, and inputting the first current signal and the value of the tuning parameter to the all pass filter.

8. The method of claim 7, wherein the value of the tuning parameter is estimated based on a look-up table that correlates machine speed frequencies with respective tuning parameter values.

9. A system for evaluating current sensor measurements of an electric machine system, comprising:

a processing module configured to acquire current sensor measurements from a first current sensor and a second current sensor connected to a three phase electric current supply to an electric machine, the first current sensor configured to measure a first phase current of the electric current supply, the second current sensor configured to measure a second phase current of the electric current supply, the processing module configured to perform:

acquiring a first current signal from the first current sensor;

acquiring a second current signal from the second current sensor;

measuring a machine speed;

shifting the first current signal by a signal processing component to generate a shifted first current signal having a shifted phase, the signal processing component including a tuning parameter that is a function of the machine speed, the signal processing component including an all pass filter configured to shift the first current signal using the tuning parameter;

estimating a phase difference between the shifted first current signal and the second current signal; and determining a plausibility of the first measurement based on the difference.

10. The system of claim 9, wherein the processing module is further configured to perform:

evaluating whether the first current sensor is operating properly based on the plausibility.

11. The system of claim 9, wherein determining the plausibility includes comparing the difference to a selected threshold difference value, and determining that the first measurement is plausible based on the difference being less than or equal to the threshold difference value.

12. The system of claim 9, wherein the signal processing component is configured to shift the first current signal independent of a frequency of the first current signal.

13. The system of claim 12, wherein the all pass filter is configured to shift the first current signal without affecting an amplitude of the first current signal.

14. The system of claim 9, wherein the all pass all pass filter is configured to shift the first current signal using a first order transfer function including the tuning parameter.

15. The system of claim 14, wherein the shifting includes determining a machine speed frequency based on the machine speed, estimating a value of the tuning parameter based on the machine speed frequency, and inputting the first current signal and the value of the tuning parameter to the all pass filter.

16. The system of claim 15, wherein the value of the tuning parameter is estimated based on a look-up table that correlates machine speed frequencies with respective tuning parameter values.

17. A computer program product comprising a computer-readable memory that has computer-executable instructions stored thereupon, the computer- executable instructions when executed by a processor cause the processor to perform operations comprising:

acquiring a first current signal from a first current sensor, the first current signal corresponding to a first phase current of a three phase electric current supply to an electric machine, the first phase current separated from a second phase current by a selected phase separation;

acquiring a second current signal from a second current sensor, the second current signal corresponding to the second phase current;

measuring a machine speed;

shifting the first current signal by a signal processing component to generate a shifted first current signal having a shifted phase, the signal processing component including a tuning parameter that is a function of the machine speed, the signal processing component including an all pass filter configured to shift the first current signal using the tuning parameter;

estimating a phase difference between the shifted first current signal and the second current signal; and determining a plausibility of the first measurement based on the difference.

18. The computer program product of claim 17, wherein determining the plausibility includes comparing the difference to a selected threshold difference value, and determining that the first measurement is plausible based on the difference being less than or equal to the threshold difference value.

19. The computer program product of claim 17, wherein the all pass filter is configured to shift the first current signal using a first order transfer function including the tuning parameter.

20. The computer program product of claim 17, wherein the shifting includes determining a machine speed frequency based on the machine speed, estimating a value of the tuning parameter based on the machine speed frequency, and inputting the first current signal and the value of the tuning parameter to the all pass filter.

* * * * *